US012568838B2

(12) United States Patent
Zhang et al.

(10) Patent No.: US 12,568,838 B2
(45) Date of Patent: Mar. 3, 2026

(54) BASE PLATE HAVING SIDEWALL, POWER SEMICONDUCTOR MODULE COMPRISING THE BASE PLATE AND METHOD FOR PRODUCING THE BASE PLATE

(71) Applicant: Hitachi Energy Ltd, Zürich (CH)

(72) Inventors: Biwei Zhang, Lenzburg (CH); Harald Beyer, Lenzburg (CH); Milad Maleki, Untersiggenthal (CH); Dominik Truessel, Bremgarten (CH); Maxime Ludwig, Zürich (CH)

(73) Assignee: HITACHI ENERGY LTD, Zürich (CH)

( * ) Notice: Subject to any disclaimer, the term of this patent is extended or adjusted under 35 U.S.C. 154(b) by 201 days.

(21) Appl. No.: 18/244,185

(22) Filed: Sep. 8, 2023

(65) Prior Publication Data

US 2023/0420315 A1 Dec. 28, 2023

Related U.S. Application Data

(63) Continuation of application No. PCT/EP2022/052332, filed on Feb. 1, 2022.

(30) Foreign Application Priority Data

Mar. 10, 2021 (EP) ..................................... 21161711

(51) Int. Cl.
*H01L 23/13* (2006.01)
*H01L 23/00* (2006.01)
(Continued)

(52) U.S. Cl.
CPC .............. *H01L 23/13* (2013.01); *H01L 24/26* (2013.01); *H01L 24/32* (2013.01);
(Continued)

(58) Field of Classification Search
CPC .......... H01L 23/13; H01L 24/32; H01L 24/26
(Continued)

(56) References Cited

U.S. PATENT DOCUMENTS 6,667,545 B1 * 12/2003 Spitz ...................... H10D 8/422
257/688
2002/0011661 A1 * 1/2002 Terasaki .................. H01L 24/01
257/E23.125
(Continued)

FOREIGN PATENT DOCUMENTS

DE 102008054932 A1 7/2010
EP 577966 A1 * 1/1994 ............. H01L 23/16
(Continued)

OTHER PUBLICATIONS

Machine_English_translation_JP_5593864_B2; Nakajima et al.; Semiconductor Device Cooler; Sep. 24, 2014; EPO; whole document (Year: 2025).*

*Primary Examiner* — Tahseen Khan
(74) *Attorney, Agent, or Firm* — PROCOPIO, CORY, HARGREAVES & SAVITCH LLP

(57) ABSTRACT

A base plate and power semiconductor module are provided, involving a basic body formed in one piece and having a front and rear side. The front side has a mounting area of the base plate. Along at least one of its edges, the basic body has at least one elevated integral part forming at least one
(Continued)

sidewall projecting beyond the mounting area by a vertical height. At mounting area regions, the basic body has vertical thickness extending between the front and rear side and being larger than the vertical height of the sidewall. Along all edges, the basic body involves either at least one sidewall or at least one groove, but not both, at the same edge. Along at least one of its edges, the basic body involves one elevated integral part forming the at least one sidewall.

20 Claims, 8 Drawing Sheets

(51) Int. Cl.
  *H01L 23/31*         (2006.01)
  *H01L 23/367*        (2006.01)
(52) U.S. Cl.
  CPC ........ *H01L 23/3121* (2013.01); *H01L 23/367* (2013.01); *H01L 2224/26175* (2013.01); *H01L 2224/32225* (2013.01); *H01L 2224/32245* (2013.01)
(58) Field of Classification Search
  USPC ........................................................ 428/157
  See application file for complete search history.

(56) References Cited

U.S. PATENT DOCUMENTS

| | | | | |
|---|---|---|---|---|
| 2009/0224384 A1* | 9/2009 | Hou | .................. | H01L 23/49503 257/676 |
| 2015/0235929 A1* | 8/2015 | Duca | ................. | H01L 23/49568 174/536 |

FOREIGN PATENT DOCUMENTS

| | | | |
|---|---|---|---|
| JP | H4-10346 | U | 1/1992 |
| JP | 1990023642 | U | 2/1992 |
| JP | H05182996 | A | 7/1993 |
| JP | H0677353 | A | 3/1994 |
| JP | 2008-34601 | A | 2/2008 |
| JP | 2008-311366 | A | 12/2008 |
| JP | 2011258814 | A | 12/2011 |
| JP | 2012142521 | A | 7/2012 |
| JP | 2013229363 | A | 11/2013 |
| JP | 5593864 | B2 * | 9/2014 |
| JP | 2014225495 | A | 12/2014 |
| JP | 2016181549 | A | 10/2016 |
| JP | 2020038933 | A | 3/2020 |
| WO | 2005043966 | A1 | 5/2005 |

* cited by examiner

BASE PLATE HAVING SIDEWALL, POWER SEMICONDUCTOR MODULE COMPRISING THE BASE PLATE AND METHOD FOR PRODUCING THE BASE PLATE

CROSS-REFERENCE TO RELATED APPLICATIONS

This application is a continuation application of International Patent Application PCT/EP2022/052332, filed Feb. 1, 2022, which claims priority to European Patent Application No. 21161711.3, filed on Mar. 10, 2021, the contents of which are incorporated herein by reference.

BACKGROUND

Field

The present disclosure relates to a base plate having sidewall/s for example for a power semiconductor module, a power semiconductor module comprising the base plate and methods for producing the base plate.

Related Art

When semiconductor chips are fixed to substrates or substrates are fixed to a base plate, due to wettability of surfaces, connecting material such as solder may spread on neighboring surfaces of the substrates or may spread over a large area of a mounting area of the base plate. This overflow of connecting material may cause contamination of areas for instance used for wire-bonding, or may lead to a reduced adhesion of an encapsulation material for instance of a housing body of a power semiconductor module resulting in delamination. Moreover, in virtue of the overflow of the connecting material, part of the connecting material may get lost, and it is possible that no sufficient connecting material is available for achieving a highly stable connection between the semiconductor chips and the substrates, between the substrates and the base plate, or between the semiconductor chips and the base plate.

If no modifications of the base plate for instance for preventing the overflow of connecting material are introduced, a strong overflow of connecting material such as of solder may occur, resulting in an unwanted deposition of solder in other regions of the base plate, especially not only on the front side but also on side surfaces or on the rear side of the base plate.

For solving these issues, solder resist may be coated on surfaces of the base plate or of the substrates to prevent or reduce the wetting of such surfaces. Coating surfaces with solder resistive material, however, requires additional processes in the production of the substrates or base plates causing higher manufacturing costs. Additionally, in case of using an organic coating material as solder resist, an outgassing of substances from the coating layer will have negative impact on further process steps for manufacturing a power semiconductor module comprising the power semiconductor module and the base plate or on the reliability and functionality of the power semiconductor module. Moreover, using solder resist may have negative impact on adhesion of encapsulation material.

Another approach for preventing the overflow of connecting material is the preparation of grooves around the mounting area. In this disclosure, the mounting area is understood to mean a surface on a front side of the base plate for receiving module components like substrates and/or chips.

The surface for fixing, for instance for screwing the base plate to carrier acting as a cooler will be referred to as assembly surface. The assembly surface can comprise surfaces outside the mounting area, for instance outside sidewall/s and/or groove/s on a front side of the base plate. However, it is possible that side surfaces and/or a rear side of the base plate can be additionally referred to as part of the assembly surface. Here, overflowing connecting material such as solder material may be collected in the grooves so that no portion or only a small portion of the assembly surface of the base plate will be contaminated by the connecting material. The grooves, however, shall be formed sufficiently large, for example in the case that thick solder meniscus shall be formed for enhancing the stability of the solder connection. This, however, will lead to a reduction of the size of the mounting area. Furthermore, on one hand, choosing a sufficiently large size of the groove, a large amount of connecting material will accumulate in the groove. This loss of connecting material may result in a locally insufficient or missing soldering connection or in the formation of voids for instance in regions next to the groove. On the other hand, if the size of the groove around the substrate soldering position is kept small, it may not sufficiently prevent the overflow of the connecting material.

Documents EP 0 577 966 A1, US 2009/224384 A1, US 2002/011661 A1, U.S. Pat. No. 6,667,545 B1, US 2015/235929 A1 and JP 2011 258814 A describe a component having a base plate or a printed circuit board and a semiconductor chip arranged on the base plate or or the printed circuit board, wherein the base plate or the printed circuit board has a structured upper surface.

SUMMARY

Embodiments of the disclosure relate to a base plate for instance for a power semiconductor module, wherein the base plate comprises an appropriate barrier structure, for example, for preventing or reducing overflow of connecting material. Another object is to provide a highly mechanically stable power semiconductor module comprising the base plate, wherein the power semiconductor module can have improved adhesion and fixation between surfaces of the base plate and a housing body, for example a molded body. Moreover, efficient methods for producing the base plate will be provided.

Embodiments of the disclosure address the above shortcomings in the art in whole or in part. Further embodiments of the base plate, the power semiconductor module comprising the base plate and of the method for producing the base plate are the subject matter of the further claims.

According to an embodiment of a base plate, which is used for example for receiving a power semiconductor module, it comprises a basic body formed in one piece. The basic body has a front side and a rear side, wherein the front side comprises a mounting area of the base plate. Along at least one of its edges, the basic body has at least one an elevated integral part forming at least one sidewall projecting beyond the mounting area by a vertical height. At regions of the mounting area, the basic body has a vertical thickness extending between the front side and the rear side of the basic body, wherein the vertical thickness of the basic body is larger than the vertical height of the at least one sidewall.

A vertical direction is understood to mean a direction which is directed perpendicular to a main extension surface of the mounting area or of the basic body. A lateral direction is understood to mean a direction which is parallel to the main extension surface of the mounting area or of the basic body. The vertical direction and the lateral direction are orthogonal to each other.

The term "along at least one of the edges" or "at the edge/s" does not necessary means "directly at the edge/s". The sidewall/s and possible groove/s are rather situated at edge regions on the front side of the basic body. The sidewall/s and/or the groove/s can extend over the whole edge region/s or only in some parts of the edge region/s. The sidewall/s may directly adjoin side surface/s of the basic body, i.e. directly adjacent to the edge/s or directly at the edge/s, or may be laterally spaced apart from the side surface/s of the basic body, i.e. laterally spaced apart from the edge/s. For example, the elevated integral part/s of the basic body forming the sidewall/s are parallel or substantially parallel to the corresponding edge/s. If the basic body comprises groove/s on its front side, the groove/s are rather laterally spaced apart from the edge/s. The groove/s can directly adjoin the sidewall/s or can be laterally spaced apart from the sidewall/s. For example, the sidewall/s is/are parallel or substantially parallel to the corresponding groove/s.

"A basic body formed in one piece" means that the basic body is made of a single piece. For example, the basic body does not comprise separate parts connected to each other for instance using a connecting material. The basic body rather comprises only integral parts integrally connected with each other, i.e. without using any additional connecting material. Such integral parts can be formed from the same material.

It is possible that the elevated integral part of the basic body forms a single sidewall along only one of the edges of the basic body. However, it is possible that the elevated integral part of the basic body forms a single continuous sidewall along more than one of the edges, for instance along exactly two or three of the edges, or along all edges of the basic body. Furthermore, it is also possible that the elevated integral part of the basic body forms at least two or more than two spatially separated sidewalls along different edges of the basic body.

Thus, when a connecting material is used for fixing for example a substrate or substrates with chips on the mounting area of the base plate, the sidewall or sidewalls, i.e. the elevated portion or elevated portions of the basic body, can act as a barrier or as a plurality of barriers for preventing the overflow of the connecting material. In this case, the power semiconductor module has a base plate and at least one substrate arranged thereon. The power semiconductor module can comprise a single substrate or a plurality of isolated substrates, a single electronic component such as a semiconductor chip or a plurality of such electronic components, one component or several components arranged on a substrate, or a plurality of components arranged of a plurality of substrates.

In the presence of the sidewall or sidewalls, it is possible that the base plate or the basic body is free, i.e. void, of recessed portion/s in form of groove/s. Since the sidewall or sidewalls is/are formed at the edge/s of the base plate, the overflow of the connecting material, for instance of solder material, can be prevented without the loss of connecting material accumulated in the groove or in different grooves. Alternatively, a combination of sidewall/s and groove/s is possible. In virtue of the presence of the sidewall/s, however, the size of the groove/s can be kept small resulting in only a very small and thus acceptable loss amount of the connecting material.

According to a further embodiment of the base plate, the basic body is made of metal or metal alloy. For example, the basic body is made of Cu or Al, or corresponding alloy. Alternatively, it is also possible that the basic body is made of a non-metallic composite material, for instance from a composite material containing SiC, for instance made of AlSiC or MgSiC. The basic body, however, is not restricted to the materials mentioned above.

According to a further embodiment of the base plate, the elevated integral part of the basic body forms at least two sidewalls projecting beyond the mounting area. The at least two sidewalls are located along two non-adjacent edges, for instance along two opposite edges of the basic body. Thus, the at least two sidewalls are spatially separated from each other. In this case, the sidewalls do not form a continuous barrier, are rather discontinuous and form two spatially separate barriers on the front side of the basic body.

According to a further embodiment of the base plate, the elevated integral part of the basic body form at least one sidewall which projects beyond the mounting area and completely surrounds the mounting area. In this case, the at least one sidewall forms a continuous barrier or a single continuous frame-shape sidewall.

According to a further embodiment of the base plate, the sidewall or each of the sidewalls has a vertical height between 0.05 mm and 5.0 mm inclusive, for instance between 0.5 mm and 2 mm. The sidewall or each of the sidewalls can have an average lateral width between 0.05 mm and 10 mm inclusive, between 0.05 mm and 5 mm, or between 0.1 mm and 5 mm inclusive, typically between 0.5 mm and 2 mm inclusive.

According to a further embodiment of the base plate, the at least one sidewall is a vertical wall, an inclined wall or a round-shaped wall. It is possible that the at least one sidewall is formed partially as vertical wall, partially as inclined wall and/or partially as round-shaped wall. The shape of sidewall/s, for instance the cross section of the sidewall/s, can be of quadratic, rectangular, trapezoidal, semicircle, triangular, or is of another form.

This disclosure, however, does not limit the geometric dimensions and the shapes, for example the form of the cross section, of the sidewall/s to the dimensions and shapes mentioned above. It is possible for the sidewall/s to have other shapes or other geometric dimensions.

According to a further embodiment of the base plate, it comprises at least one groove. The groove can extend along at least one of the edges or along several edges or along all edges of the basic body. Along a lateral direction, the mounting area can be delimited by the groove. In deviation from this, it is also possible that the mounting area is delimited by the sidewall and the sidewall is located between the mounting area and the groove.

According to a further embodiment of the base plate, the groove is directly adjacent to the at least one sidewall. In this case, the at least one sidewall can extend continuously, for instance directly into the groove. Thus, the production of the at least one sidewall and of the groove can be carried out in a common manufacturing process or in two subsequent process steps, for instance in a first process step for forming the at least one sidewall and in a second process step for forming the groove, for example using a stamping method. For example, along at least one of the edges of the basic body, for instance along exactly one, exactly two, exactly three or along all edges of the basic body, the basic body comprises both the at least one sidewall and the groove.

According to a further embodiment of the base plate, along at least one of the edges or along several edges, the basic body has both the at least one sidewall and the groove, wherein in a plane view of the front side of the basic body, the groove is located between the mounting area and the at least one sidewall, or the at least one sidewall is located between the mounting area and the groove. It is possible that the groove directly adjoins the at least one sidewall or is laterally spaced apart from the at least one sidewall.

Compared to the case of the basic body without the sidewall, in the presence of the sidewall/s, the groove/s may have reduced lateral width and/or reduced vertical depth. Thus, it is not necessary for the size of the groove to be chosen sufficiently large, as a result of which, on one hand possible loss of the connecting material can be kept small, and on the other hand, the size of the mounting area can be maintained large. Moreover, depending on the presence of the sidewall/s and the amount of expected overflow of connection material, it is possible to design the width and/or the depth of the groove/s accordingly, thus enhancing the flexibility in designing the base plate.

For example, the width of the groove/s is between 0.05 mm and 5 mm inclusive, for instance between 0.5 mm and 2 mm. The depth of the groove/s can be between 0.05 mm and 3 mm, for instance between 0.05 mm and 2 mm or between 0.05 mm and 1 mm, inclusive. The shape of the groove/s can be quadratic, rectangular, trapezoidal, partially round, semicircle, triangular, or is of another form. This disclosure, however, does not limit the geometric dimensions and the shapes, for example the form of the cross section, of the groove/s to the dimensions and shapes mentioned above.

According to a further embodiment of the base plate, along all edges, the basic body comprises either at least one sidewall or at least one groove but not both sidewall and groove. For example, the basic body comprises two sidewalls located at two opposite edges and two grooves located at two another edges of the basic body. Other combinations of the sidewall/s and of the groove/s at different edges of the basic body are also possible.

According to a further embodiment of the base plate, it comprises a plurality of cooling fins on the rear side of the basic body. The cooling fins may be formed as integral parts of the basic body. In this case, the cooling fins and the sidewall/s may be made of the same material. It is, however, possible for the cooling fins to be made of a material different from that of the sidewall/s. In this case, the cooling fins may not be considered as integral parts of the basic body but rather as additional structures provided on the rear side of the basic body.

According to an embodiment of a power semiconductor module, it comprises a base plate, for instance the base plate described here in this disclosure. The power semiconductor module further comprises a housing body, wherein the housing body laterally surrounds, for instance completely surrounds the base plate. The at least one sidewall can be completely covered by the housing body and serves as an anchoring structure which additionally fixes the housing body to the base plate. The housing body can be a mold body or a body made of a gel material, wherein the gel material can fill the power semiconductor module having a housing frame. The housing body, however, is not restricted to the mold body or the body made of a gel material.

According to a further embodiment of the power semiconductor module, it comprises a housing body, wherein the housing body laterally surrounds the base plate and the at least one sidewall is completely covered by the housing body. The groove can be at least partially filled by a material of the housing body so that both the at least one sidewall and the groove serve as anchoring structures which additionally fix the housing body to the base plate. It is possible that several grooves can be partially or fully filled by a material of the housing body so that the grooves serve as anchoring structures fixing the housing body to the base plate.

According to a further embodiment of the power semiconductor module, it comprises at least one module component, for instance at least one substrate having one or a plurality of chips arranged thereon. The module component is fixed on the mounting area by a connection layer. For example, the housing body laterally surrounds the module component. The module component may comprise one or a plurality of substrates and/or one or a plurality of chips such as semiconductor chips, electronic or optoelectronic chips or discrete devices like resistors, capacitors or inductivities.

According to a further embodiment of the power semiconductor module, the at least one sidewall and/or the groove are/is formed to prevent material of the connection layer, for instance solder material, sinter material or glue, from creeping towards side surfaces or towards the rear side of the basic body. The connection layer is for instance a solder, a sintering or a gluing layer. Thus, the sidewall/s or the groove/s or a combination of the sidewalls and of the grooves can form a barrier structure which partially or completely surrounds the mounting area for preventing overflow of connecting material.

Because of the prevention of overflow of connecting material, for instance of solder overflow, the yield of the process for fixing module components of the power semiconductor module to the base plate can be improved resulting in a reduction of overall manufacturing costs. Additionally, a visual inspection after fixing the power semiconductor module on the mounting area can be waived. Finally, any reduction of unwanted contamination will result in an improved reliability of the semiconductor power module.

According to an embodiment of a method for producing the base plate, the basic body having the sidewall/s or the whole base plate with or without cooling fins is manufactured in a single common manufacturing process or in two subsequent, for instance different manufacturing processes. For example, the basic body is manufactured by at least one of: forging, stamping, milling or by another machining process. It is also possible that the basic body or the whole base plate with or without cooling fins is formed by a casting process or by a forming process.

In case of a applying a casting process or a forming process, the sidewall/s and or the groove/s of the basic body can be prepared by a modified forming tool. It is also possible that the cooling fins are formed in the same manufacturing process as the sidewall/s and/or the grooves. Thus, no additional cost is expected for implementing the sidewall/s. The groove or a plurality of grooves, however, can be formed subsequently, for instance by a machining process such as stamping or milling by another machining process after the sidewall/s have been formed.

According to another embodiment of a method for producing the base plate, the basic body comprising the at least one sidewall and/or the groove are/is produced in a single common casting or forming process. In this case, the sidewall/s and the groove/s of the basic body, for instance even together with the cooling fins, can be prepared by a modified forming tool. Thus, using the casting or any other forming process, the sidewalls and the grooves can be implemented by a small modification of the casting or shaping tool.

Thus, the sidewall/s and the groove/s can be formed by two subsequent manufacturing processes. It is also possible for the basic body comprising the sidewall and/or the groove/s to be produced in a single common manufacturing process.

The present disclosure comprises several aspects of a base plate, a power semiconductor module comprising the base plate and methods for manufacturing the base plate. Every feature described with respect to one of the aspects is also disclosed herein with respect to the other aspect, even if the respective feature is not explicitly mentioned in the context of the specific aspect. For example, the power semiconductor module can comprise any of the base plates described here. The methods described above are directed to the production of any of the base plates described here. Thus, features and advantages described in connection with the base plate can be used for the power semiconductor module and for the methods, and vice versa.

While the disclosure is amenable to various modifications and alternative forms, specifics thereof are shown by way of example in the figures and will be described in detail. It should be understood, however, that the intention is not to limit the disclosure to the particular embodiments described. On the contrary, the intention is to cover all modifications, equivalents, and alternatives falling within the scope of the disclosure defined by the appended claims.

BRIEF DESCRIPTION OF DRAWINGS

The accompanying figures are included to provide a further understanding. In the figures, elements of the same structure and/or functionality may be referenced by the same reference signs. It is to be understood that the embodiments shown in the figures are illustrative representations and are not necessarily drawn to scale.

DETAILED DESCRIPTION

Figures 1A, 1B:
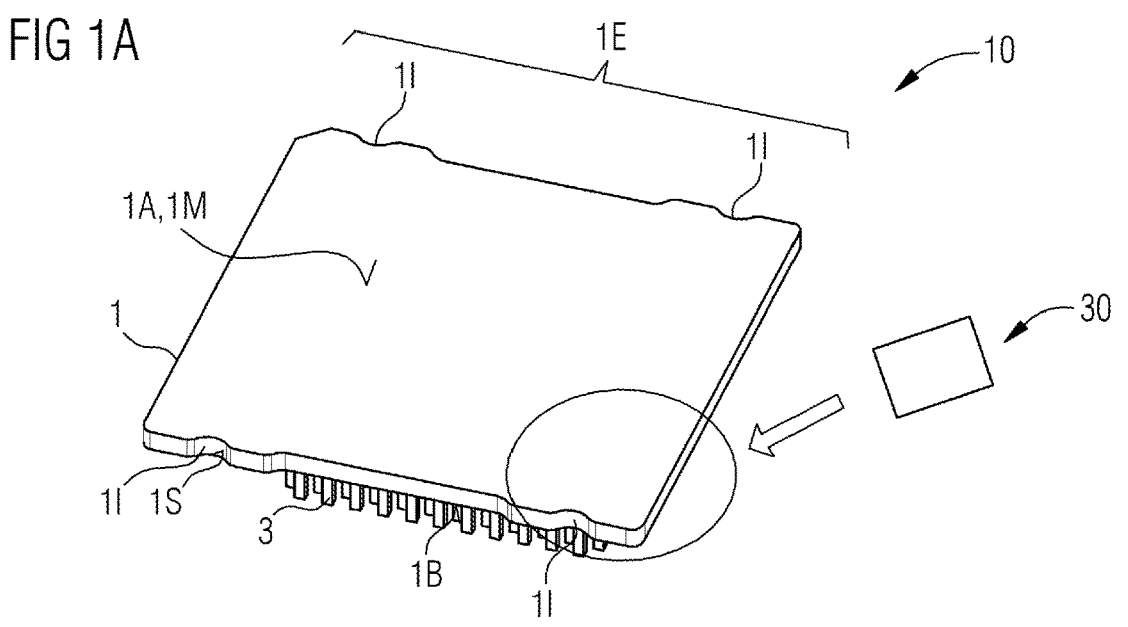
FIG. 1A shows a perspective view of a base plate according to a comparative example, wherein a module component can be fixed on the base plate for forming a power semiconductor module.
FIG. 1B shows a perspective view of a base plate according to an embodiment.

FIG. 1A shows a base plate 10 for instance for receiving a module component 30 which is also indicated in FIG. 1A. This comparative base plate 10 is introduced for comparison purposes and for illustrating some technical effects described in this disclosure and shall not be considered as state of art. Features described in connection with the base plate 10 shown in FIG. 1A can be used for all embodiments of the base plate 10 in this disclosure.

The base plate 10 comprises a standard basic body 1 without sidewalls and grooves. The basic body 1 has a front side 1A and a rear side 1B, wherein the front side 1A comprises a mounting area 1M of the base plate 10. The module component 30 can be fixed on the mounting area 1M of the base plate 10 for forming a power semiconductor module 100. The base plate 10 has a plurality of cooling fins 3 formed on the rear side 1B.

The base plate 10 comprises lateral indentations 1I on its side surfaces 1S. In FIG. 1A, the base plate 10 has two opposite side surfaces 1S, wherein each of the opposite side surfaces 1S has two lateral indentations 1I. For example, the indentations 1I are configured to fix or to screw the base plate 10 to a cooler. For instance, the indentations 1I are configured to receiving crews. Along vertical direction, the indentation may extends from the front side 1A to the rear side 1B of the basic body 1. Thus, the side surfaces 1S or the rear side 1B shall not be referred to as mounting area 1M for receiving module components 30 such as substrates and/or chips but are rather referred to as assembly surface 1Z for fixing the base plate 10 for instance to a cooler.

When the module components 30 of the power semiconductor module 100, for instance substrates, electronic or semiconductor chips, are fixed to the base plate 10, due to wettability of surfaces, connecting material of a connection layer 2 such as solder material may spread over a large area of the mounting area 1M of the base plate 10. This may lead to an overflow of the connecting material. The overflow of the connecting material may cause contamination at the edges 1E, on side surfaces 1S or on the rear side 1B of the basic body 1 or of the base plate 10. Besides contamination, this also leads to significant loss of connecting material.

For example, using a scanning acoustic microscope (SAM) picture of a power semiconductor module 100 having components soldered on the mounting area 1M, locally missing soldering connection and voids or overflow of soldering material can be observed.

FIG. 1B shows a base plate 10 having a barrier structure for preventing or reducing the overflow of the connecting material. The base plate 10 comprises a basic body 1 formed in one piece. The basic body 1 can be made of metal such as Cu or Al or of metal alloy or of a composite material containing SiC such as AlSiC or MgSiC, but is not limited thereto. Along its edges 1E, the basic body 1 has an elevated integral part forming at least one sidewall 11 which projects beyond the mounting area 1M by a vertical height 11H. The barrier structure is formed for instance only by the at least one sidewall 11. For example, the at least one sidewall 11 delimits the basic body 1 in one or in all lateral directions. The at least one sidewall 11 has a lateral width 11W. This lateral width 11W can be seen as average width 11W of the at least one sidewall 11.

The basic body 1 has a vertical thickness 1T extending along the vertical direction between the front side 1A and the rear side 1B. In least at regions of the mounting area 1M, the vertical thickness 1T of the basic body 1 is larger than the vertical height 11H of the at least one sidewall 11. For example, the vertical thickness 1T of the basic body 1 is least 2, 3, 5 or at least 10 or 20 times larger than the vertical height 11H of the at least one sidewall 11.

The basic body 1 has a lateral diagonal width 1W. The lateral diagonal width 1W can be seen as the largest lateral expansion of the basic body 1. For example, the lateral diagonal width 1W of the basic body 1 is least 5, 10, 15, 20 or at least 50 times larger than the vertical thickness 1T of the basic body 1.

The vertical height 11H of the at least one sidewall 11 can be between 0.05 mm and 2.0 mm inclusive, for instance between 0.05 mm and 1.5 mm inclusive or between 0.05 mm and 1.0 mm inclusive. The lateral or average lateral width 11W of the at least one sidewall 11 can be between 0.05 mm and 10 mm inclusive, for instance between 0.1 mm and 5 mm inclusive, between 0.1 mm and 3 mm inclusive or between 0.1 mm and 1 mm inclusive. In case of doubt, the vertical height 11H and the lateral width 11W of the at least one sidewall 11 shall be understood as the average vertical height and the average lateral width of the at least one sidewall 11, respectively.

The at least one sidewall 11 can have a typical height 11H of 0.15-0.3 mm and a typical width 11W of 0.5 mm. Nevertheless, other dimensions are possible. The shape of the sidewall 11 is not fixed, and an arbitrary shape is possible. Typical shapes related to cross sections of the sidewall 11, however, may be quadratic, rectangular, trapezoidal, semicircle or triangular.

As shown in FIG. 1B, the elevated integral part of the basic body 1 forms a single continuous sidewall 11 along all edges 1E of the basic body 1. The sidewall 11 completely surrounds the mounting area 1M. In deviation from FIG. 1B, it is possible for the sidewall 11 to extend only along one edge 1E, only along two edges 1E or along only three edges 1E of the basic body 1.

According to FIG. 1B, the sidewall 11 is a partially inclined wall. The sidewall 11 has an inner surface 11A facing the mounting area 1M, wherein the inner surface 11A is inclined. Moreover, the sidewall 11 has outer surface facing away from the mounting area 1M, wherein the outer surface is a vertical surface. With increasing vertical distance from the mounting area 1M, the cross section of the sidewall 11 decreases.

At least one part of the mounting area 1M can be coated with a material for achieving an improvement of wetting compared to the case of uncoated mounting area 1M. It is possible that at least part of the mounting area 1M is formed directly by a surface of the basic body 1. For example, the mounting area 1M have one or a plurality of joining areas, which—after receiving module component/s 30—is/are covered by the module component/s 30. Such joining area/s can be coated with a material for achieving an improvement of wetting (e.g. copper coating, nickel coating, etc.). Solder resist can be applied to areas which should not be wetted e.g. surroundings of the joining areas. It is possible, however, that the base plate 10 or the basic body 1 is free, i.e. void, of solder resist.

The base plate 10 has a plurality of cooling fins 3 formed on the rear side 1B. The cooling fins 3 may be formed as integral parts of the basic body 1 and can be formed from the same material as that of the sidewall/s 11 or of the remaining part of the basic body 1. It is, however, possible for the cooling fins 3 to be made of a material that compared to the material of the basic body 1 has higher thermal conductivity. For example, the cooling fins 3 are the outermost structures on the rear side 1B of the base plate 10. Hence, along a vertical direction, the base plate 10 can be delimited by the cooling fins 3. In this case, the base plate 10 has a structured rather than a planar or flat rear side 1B. The cooling fins 3 may cover more than 20%, 30%, 40%, 50% or even more than 60% or 70% of the area of the rear side 1B of the base plate 10.

Figure 1C:
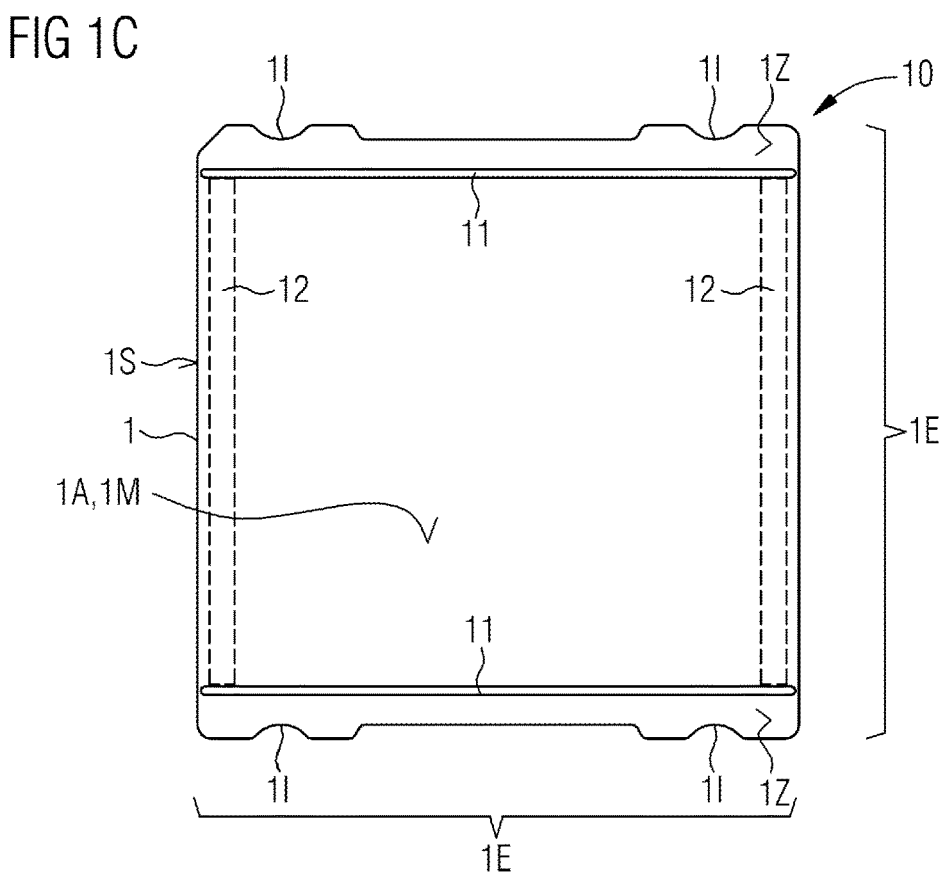
FIGS. 1C and 1D show top views of further base plates according to further embodiments.

FIG. 1C shows a further base plate 10 according to a further embodiment. The base plate 10 shown in FIG. 1C essentially corresponds to the base plate 10 shown in FIG. 1B. In contrast, the elevated integral part of the basic body 1 forms exactly two sidewalls 11 projecting beyond the mounting area 1M. The two sidewalls 11 are located along two opposite edges 1E of the basic body 1 and thus are spatially separated from each other. Each of the two sidewalls 11 extends along one entire edge 1E of the basic body 1.

Furthermore, in contrary to FIG. 1B, according to FIG. 1C, the base plate 10 has two grooves 12 located along two another opposite edges 1E of the basic body 1. Thus, the two grooves 12 are spatially separated from each other. According to FIG. 1C, along all edges 1E, the basic body 1 comprises either one sidewall 11 or one groove 12 but not both.

In deviation from FIG. 1C, other combinations of the sidewalls 11 and of the grooves 12 are also possible. For example, the basic body can have exactly one sidewall 11 located along one edge and one groove 12 or several grooves 12 along the remaining edges, or vice versa. It is also possible for the basic body 1 to have sidewall/s 11 located along exactly two adjoining edges 1E and groove/s 12 along the remaining edges 1E, or vice versa. The mounting area 1M can be completely surrounded by the sidewall/s 11 and the groove/s 12. It is also possible that at least one edge 1E or several edges 1E of the basic body is/are neither provided with a groove 12 nor with one sidewall 11.

It is also possible that sidewall/s 11 are prepared only partly around the mounting area 1M. For example, for a quadratic or rectangular base plate 10, the sidewall/s 11 may be prepared along 1 to 3 edges 1E of the basic body 1, whereas no sidewall/s 11 or other structures, for instance the grooves 12 are prepared on the other 3 to 1 edges 1E, respectively. Alternatively, it is also possible that the grooves 12 are prepared on the other 3 to 1 edges 1E having no sidewall 11. Furthermore, it is also possible that at least one sidewall 11 and/or at least one groove 12 are/is prepared in one part of one edge region but does not extend along the entire edge of the base plate 10.

Figure 1D:
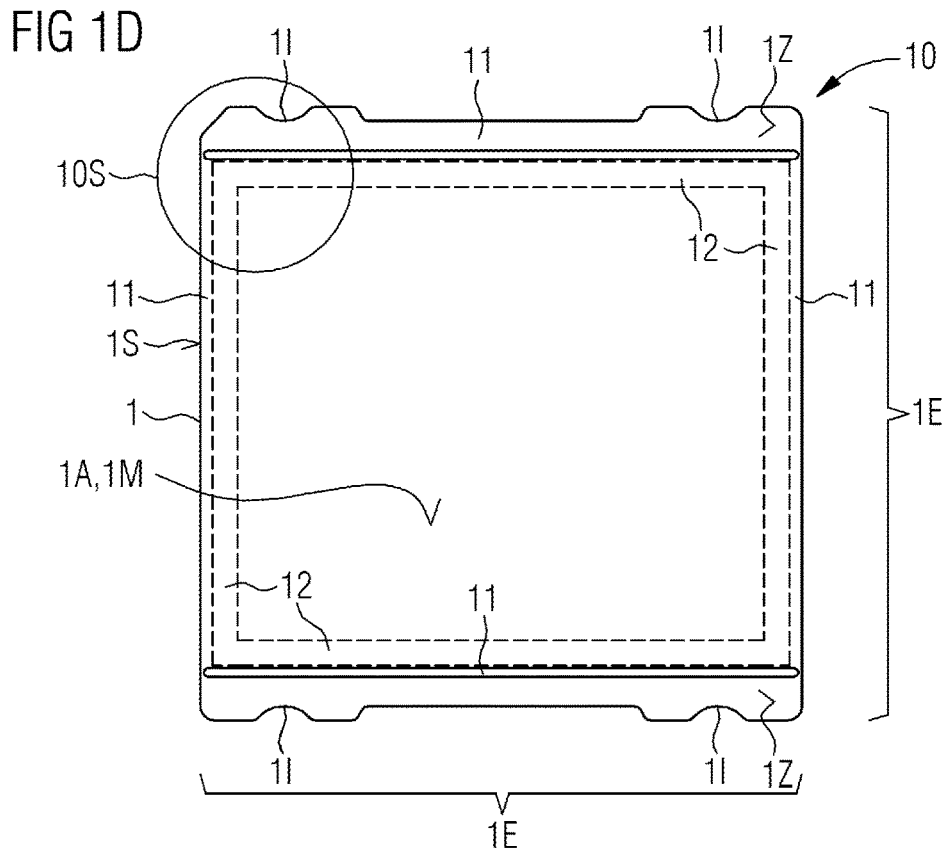

FIG. 1D shows a further base plate 10 according to a further embodiment. The base plate 10 shown in FIG. 1D essentially corresponds to the base plate 10 shown in FIG. 1B. In contrast, in lateral directions, the mounting area 1M is completely surrounded by both a continuous groove 12 and a continuous sidewall 11. Each of the continuous groove 12 and of the continuous sidewall 11 is frame-shaped. The continuous groove 12 is located between the continuous sidewall 11 and the mounting area 1M. In lateral direction, the mounting area 1M is delimited by the groove 12.

In deviation from FIGS. 1C and 1D, another combinations of the sidewall/s 11 and/or of the groove/s 12 are also possible. For instance, it is possible for the groove 12 to be formed as a continuous groove 12 which extends along exactly one, exactly two or exactly three edges 1E of the basic body 1. Furthermore, it is also possible that the groove 12 completely surrounds the mounting area 1M of the base plate 10, while the sidewall 12 does not completely surround the mounting area 1M. As another alternative, the basic body 1 can comprise exactly two grooves 12 and two sidewalls 11 located at exactly two opposite edges 1E of the basic body 1.

Figure 2A:
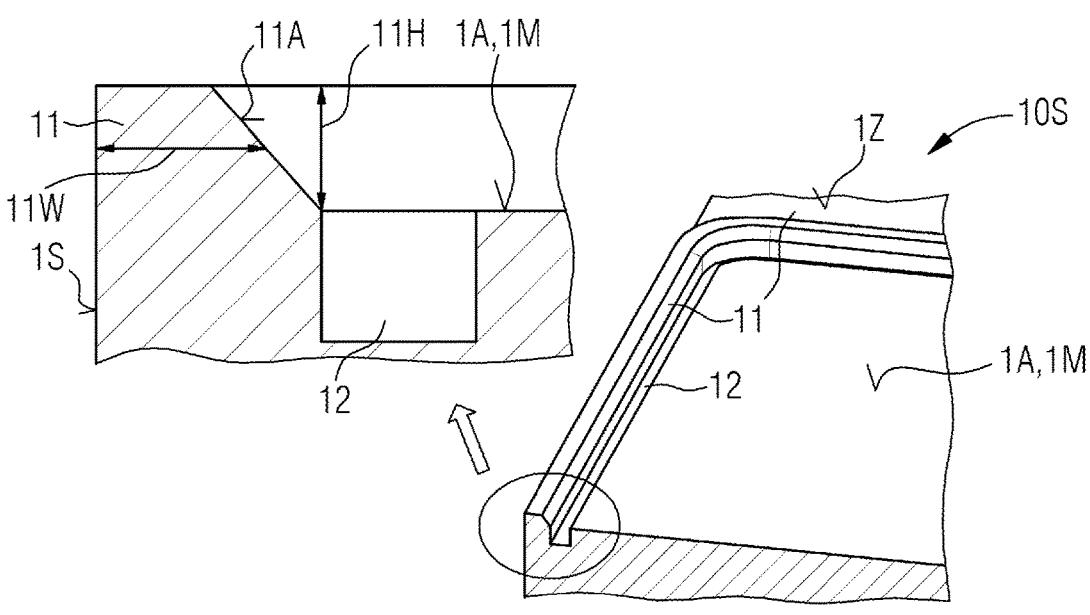
FIGS. 2A and 2B show perspective and cross section views of different sections of different base plates having sidewall and groove.

FIG. 2A show greater details of a section 10S of the base plate 10 highlighted in FIG. 1D. As shown in FIG. 2A, the groove 12 is directly adjacent to the sidewall 11. Thus, the barrier structure for preventing overflow of connecting material is formed by a coherent structure comprising a sidewall-portion and a groove-portion. Here, the sidewall 11 extends continuously or directly into the groove 12.

As shown in FIG. 2A, the groove 12 has vertical walls and flat bottom surface. Along vertical direction, the cross section of the groove 12 is substantially constant. The sidewall 11, however, is inclined. Thus, there is a jump or a kink in a transition region between the sidewall 11 and the groove 12. For example, the sidewall 11 has inner surface 11A which is tilted by 20° to 70° or by 30° to 60° with respect to the mounting area 1M. For example, as shown in FIG. 2A, the inner surface 11A of the sidewall 11 is tilted 45° with respect to the mounting area 1M. The groove 12 has inner vertical surfaces which form an angle of 90° respect to the mounting area 1M. Thus, FIG. 2A shows a combination of 45° sidewall 11 and 90° groove 12.

Figure 2B:
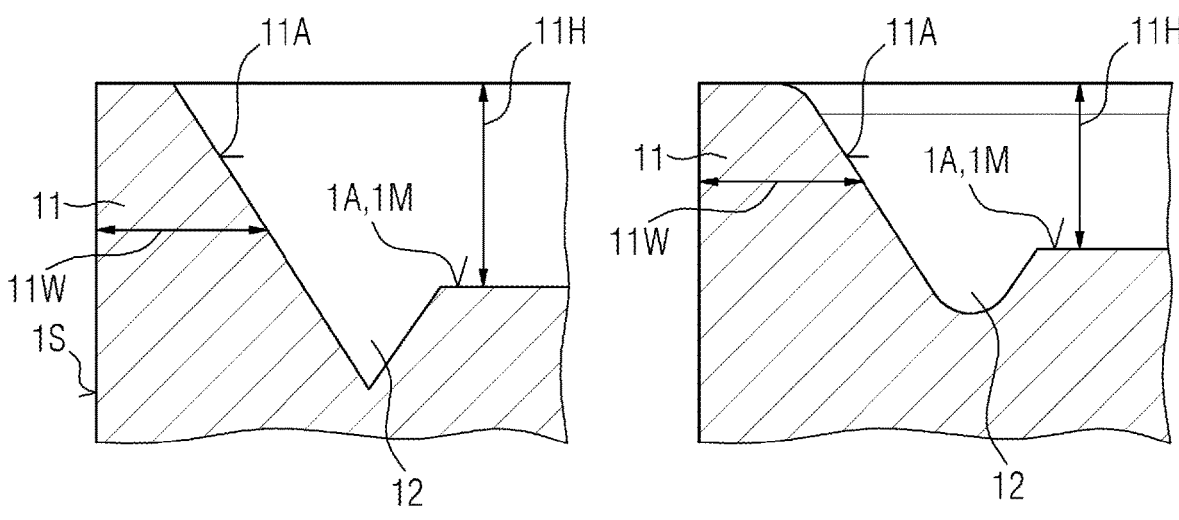

FIG. 2B shows further geometric shapes of the groove 12 and of the sidewall 11. For example, there is no jump or no kink in the transition region between the sidewall 11 and the groove 12. There is rather a smooth transition between the sidewall 11 and the groove 12. On the left hand side, FIG. 2B shows a combination of 45° sidewall 11 and 45° groove 12. On the right hand side, FIG. 2B shows a combination of 45° sidewall and round-shaped groove 12. Along vertical direction towards the mounting area 1M, the cross section of the groove 12 increases.

Figure 2C:
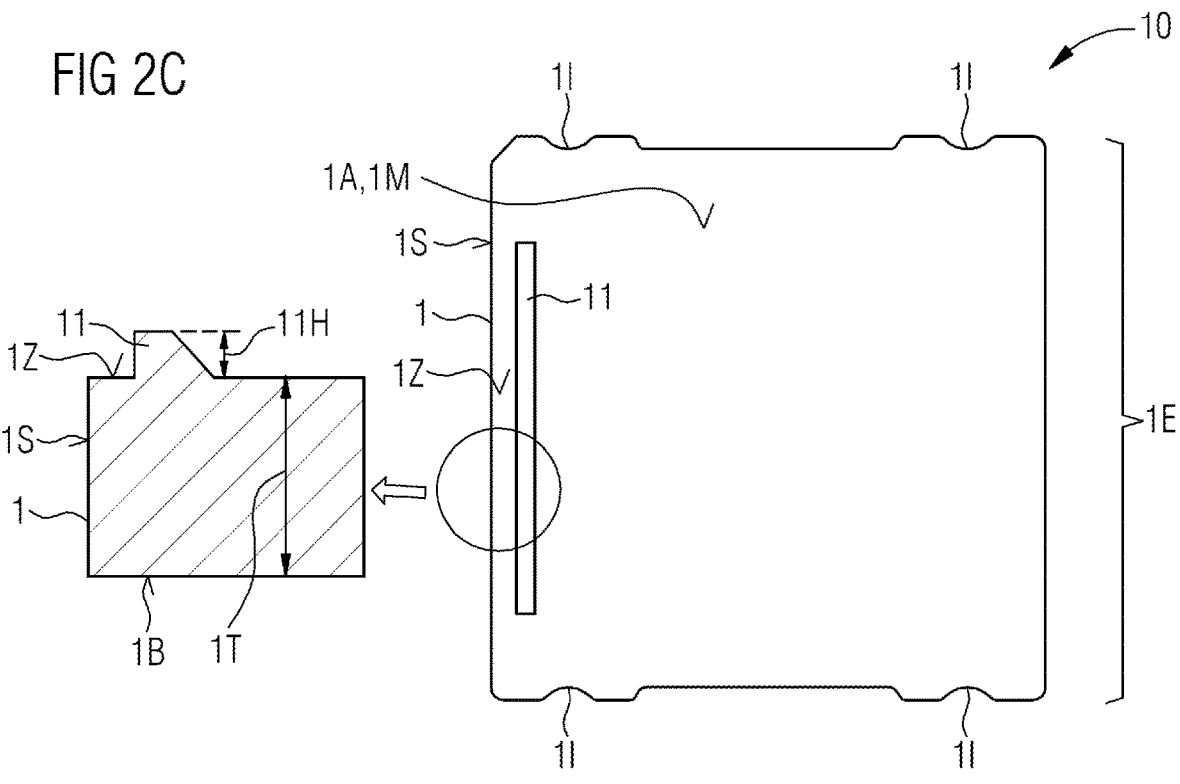
FIG. 2C shows a top view of a base plate according to an embodiment.

FIG. 2C shows a further base plate 10 according to a further embodiment. The base plate 10 shown in FIG. 2C essentially corresponds to the base plate 10 shown for instance in FIG. 1B. In contrast, the base plate 10 shown in FIG. 2C comprises only one single sidewall 11 on the front side 1A of the basic body 1. The sidewall 11 does not extend along the entire corresponding edge 1E and is spaced apart from the side surface 1S. Moreover, the base plate 10 can be free of cooling fins 3.

Figure 3A:
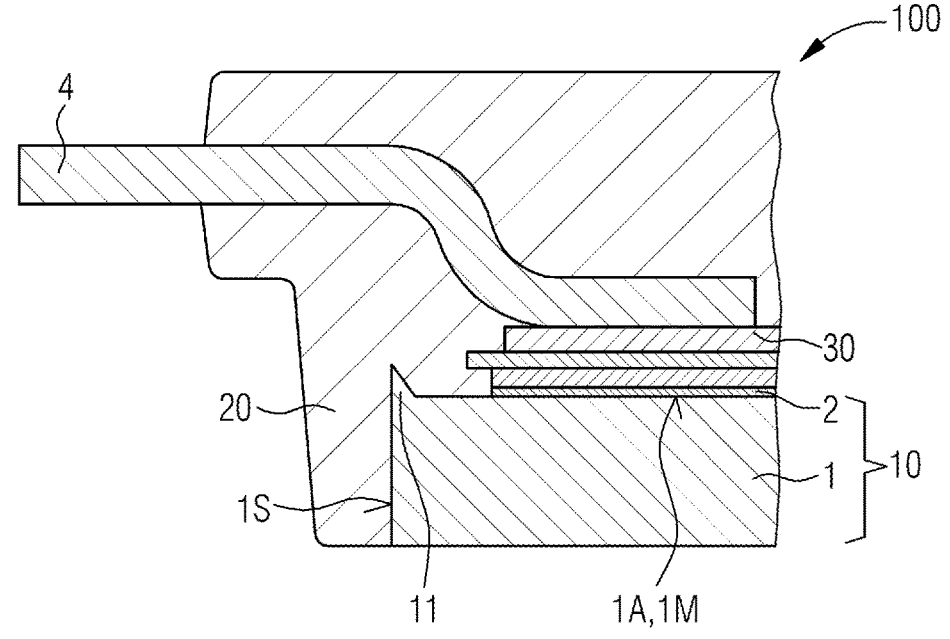
FIG. 3A shows a cross section view of a power semiconductor module having a base plate according to an embodiment.

FIG. 3A shows an embodiment of a power semiconductor module 100 which comprises a base plate 10, for instance any one of the base plates 10 described above. The power semiconductor module 100 further comprises a housing body 20, wherein the housing body 20 laterally surrounds, for instance completely surrounds the base plate 10. The sidewall 11 can be completely covered by the housing body 10 and serves as an anchoring structure which additionally fixes the housing body 20 to the base plate 10.

In top view, the housing body 20 can partially or completely cover the base plate 10. For example, the housing body 20 is formed by a molding or casting or filling process.

The power semiconductor module 100 further comprises a module component 30, wherein the module component 30 is fixed on the mounting area 1M by a connection layer 2. The connection layer 2 can be a solder layer or a sintering or a gluing layer. The housing body 20 can laterally surround, for instance completely surround the module component 30. The power semiconductor module 100 comprises a terminal 4 for instance for electrically connecting the module component 30. The terminal 4 can be externally electrically connected to an external electrical source at a side face of the housing body 20. The power semiconductor module 100 can comprise a plurality of such terminals 4.

For example, the module component 30 comprises one substrate or a plurality of laterally separated substrates and/or electronic or optoelectronic chips. The module component 30 can be fixed on the mounting area 1M by a soldering, gluing, sintering process. Thus, the connection layer 2 may be a solder layer, a sintering layer, an adhesive layer or a gluing layer. For instance, the connection layer 2 does not completely cover the mounting area 1M of the base plate 10. Depending on the spreading of the connecting material, the connection layer 2, however, can be at least partly directly adjacent to the sidewall 11 of the basic body 1, or to the groove 12 if the groove 12 is on the inner side and the sidewall 11 is on the outer side.

In vertical direction, the sidewall/s 11 can project beyond the connection layer 2. In lateral directions, the module component 30 can be surrounded by the sidewall/s 11 and/or groove/s 12. The groove/s 12 can be partially or fully filled with material of the connection layer 2. Such case can occur in a power semiconductor module 100 shown for example in FIG. 3B. Along a vertical direction, a rear side of the module component 30 or of the components of the module component 30 is located below a top surface of the sidewall/s 11, while a front side of the module component/s 30 can be located above the top surface of the sidewall/s 11. In other words, the module component/s 30 is/are not situated entirely above the sidewall/s 11.

Figure 3B:
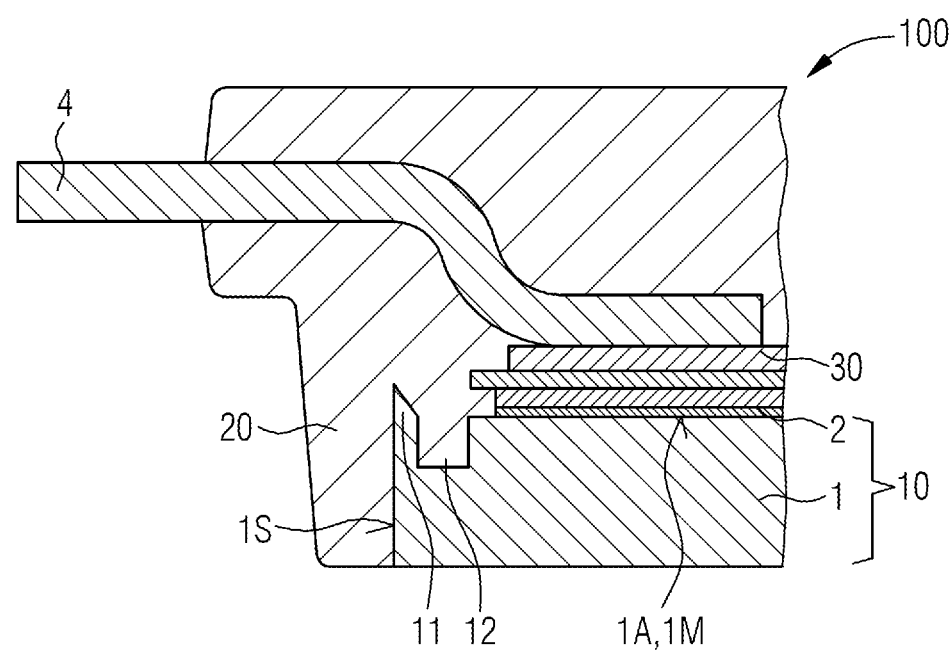
FIG. 3B shows cross section view of a power semiconductor module having a base plate according to another embodiment.

FIG. 3B shows a further power semiconductor module 100 according to a further embodiment. The power semiconductor module 100 shown in FIG. 3B essentially corresponds to the power semiconductor module 100 shown in FIG. 3A. In contrast, the base plate 10 or the basic body 1 of the base plate 10 shown in FIG. 3B comprises at least one sidewall 11 and at least one groove 12. The sidewall 11 and/or the groove 12 are/is formed to prevent material of the connection layer 2 from creeping towards side surfaces 1S or towards the rear side 1B of the basic body 1, before the housing body 20 is formed.

For example, the groove 12 is at least partially filled or fully filled by a material of the housing body 20 so that both the sidewall 11 and the groove 12 serve as anchoring structures which additionally fixe the housing body 20 to the base plate 10. It is also possible that the groove 12 is partially filled with material of the connection layer 2 and partially filled with material of the housing body 20.

A conventional power semiconductor module 100 comprising a base plate 10 covered or surrounded by a housing body 20 sometimes has inadequate stability between the base plate 10 and the housing body 20 on account of poor adhesion between the housing body 20 and the base plate 10. Using the sidewall/s 11 and/or the groove/s 12 as anchoring structures, on one hand, the contact surface is enlarged, and on other hand, the housing body 20 can engage into the anchoring structures, as a result of which the stability of the power semiconductor module 100 is increased. For example, especially in case the housing body 20 is a mold body, the sidewall/s 11 and/or the groove/s 12 can improve the overall molding by mitigating the risk of mold edge break and prevent the delamination on the interface between the base plate 10 and the housing body 20, since more contact surfaces are provided for the housing body 20, and the sidewall/s 11 and/or the groove/s 12 can act as anchoring structures for the housing body 20.

For preventing overflow of connecting material, using sidewalls 11 or elevated portions on edges 1E of a base plate 10 instead of using grooves 12, the loss of connecting material in the grooves 12 can be prevented. Alternatively, a combination of sidewall/s 11 and groove/s 12 is possible, wherein the groove 12 can be provided as inner part and the sidewall 11 as outer part of a barrier structure. In virtue of the presence of the sidewall 11, the groove 12 can be kept small resulting in only a very small and acceptable loss of connecting material. Depending on the design the module e.g. with respect to space, the sidewalls 11 and/or grooves 12 can be implemented also partly—e.g. a sidewall 11 with or without grooves 12 on different edges 1E of the basic body 1 or of the base plate 10.

Figure 4A:
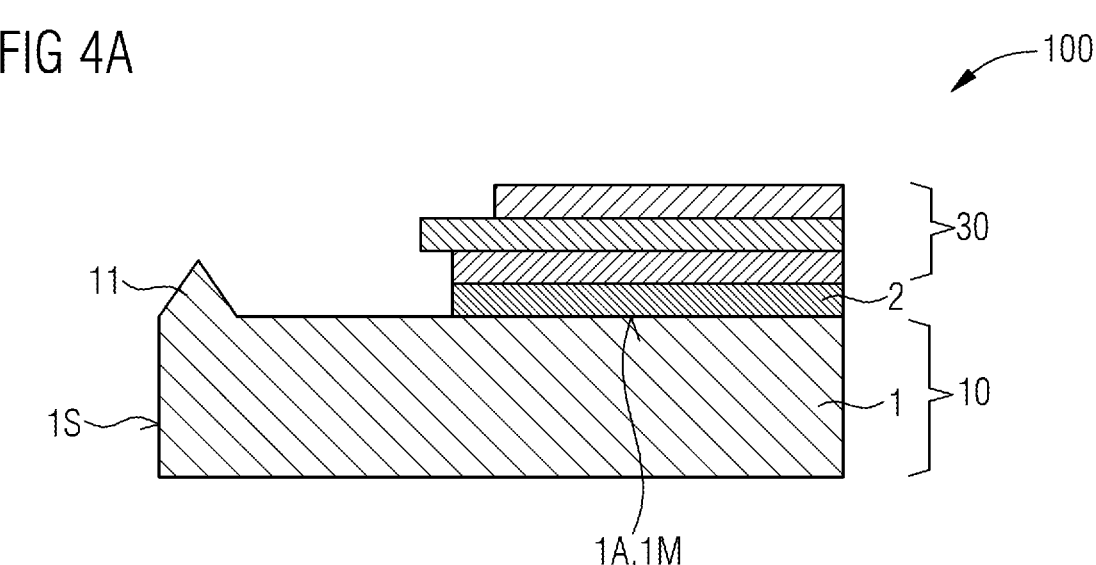
FIGS. 4A, 4B, 4C, 4D, 4E, 4F and 4G show cross section views of further power semiconductor modules having a base plate according to further embodiments.

FIGS. 4A to 4G show some exemplary embodiments of the power semiconductor module 100. The power semiconductor module 100 shown in FIG. 4A is essentially the power semiconductor module 100 shown in FIG. 3A. Only for the sake of clearness and for having a better comparison with further embodiments of the power semiconductor module 100 shown in FIGS. 4B to 4G, in FIG. 4A, the housing body 20 and the terminal 4 are not shown. According to FIG. 4A the sidewall 11 is directly adjacent to the side surface 1S. Thus, the sidewall 11 is located directly at one edge of the basic body 1.

Figure 4B:
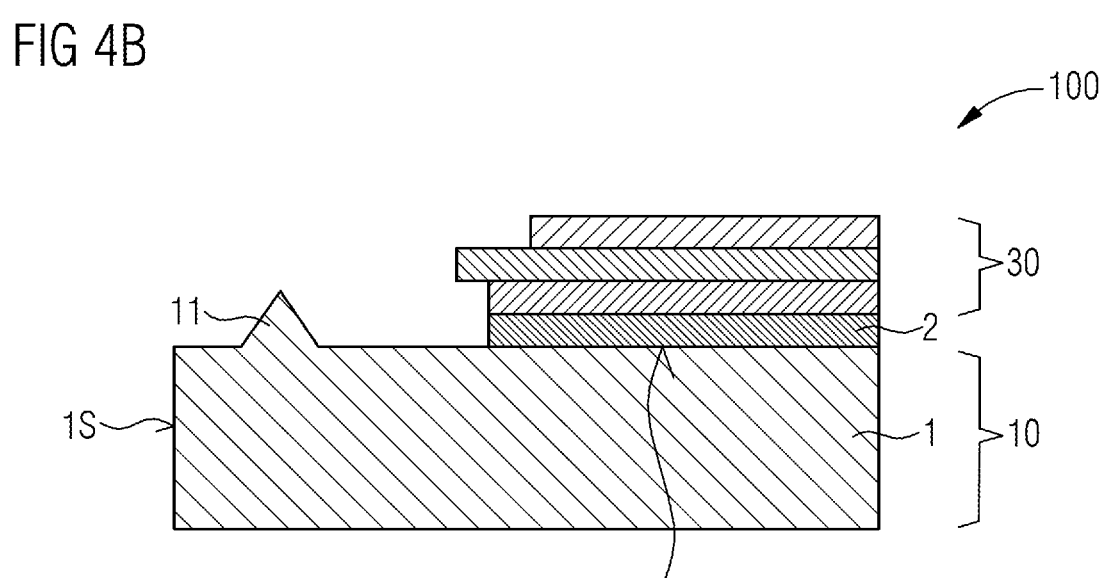

The power semiconductor module 100 shown in FIG. 4B essentially corresponds to the power semiconductor module 100 shown in FIG. 4A. In contrast, in top view, the sidewall 11 is spaced apart from the corresponding side surface 1S. Hence, the sidewall 11 is laterally spaced apart from one corresponding edge of the basic body 1.

Figure 4C:
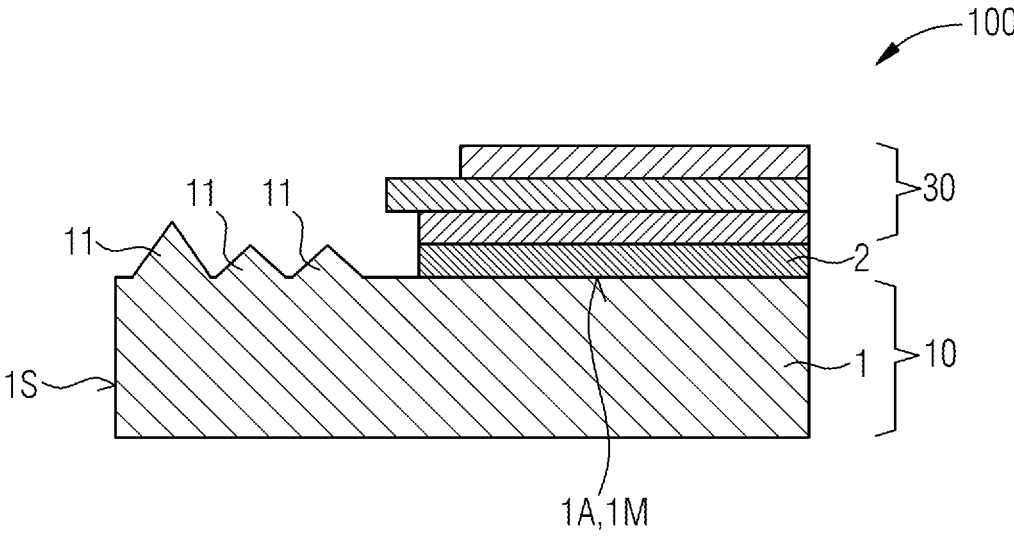

The power semiconductor module 100 shown in FIG. 4C essentially corresponds to the power semiconductor module 100 shown in FIG. 4B. In contrast, in at least one edge region on the front side 1A of the basic body 1, the basic body 1 has several sidewalls 11, in this case three sidewalls 11. The sidewalls 11 can be directly adjacent to each other or are laterally spaced apart from each other. For example, the sidewalls 11 are parallel or substantially parallel to each other.

Figure 4D:
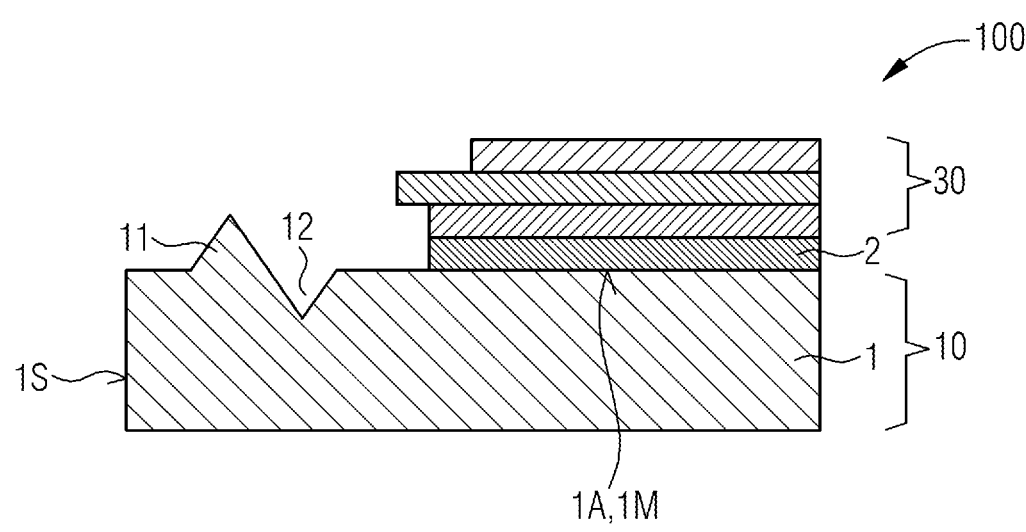

The power semiconductor module 100 shown in FIG. 4D essentially corresponds to the power semiconductor module 100 shown in FIG. 4B. In contrast, in least at one edge region on the front side 1A of the basic body 1, the basic body 1 has one groove 12 directly adjoining the sidewall 11. The groove 12 is located between the sidewall 11 and the mounting area 1M.

Figure 4E:
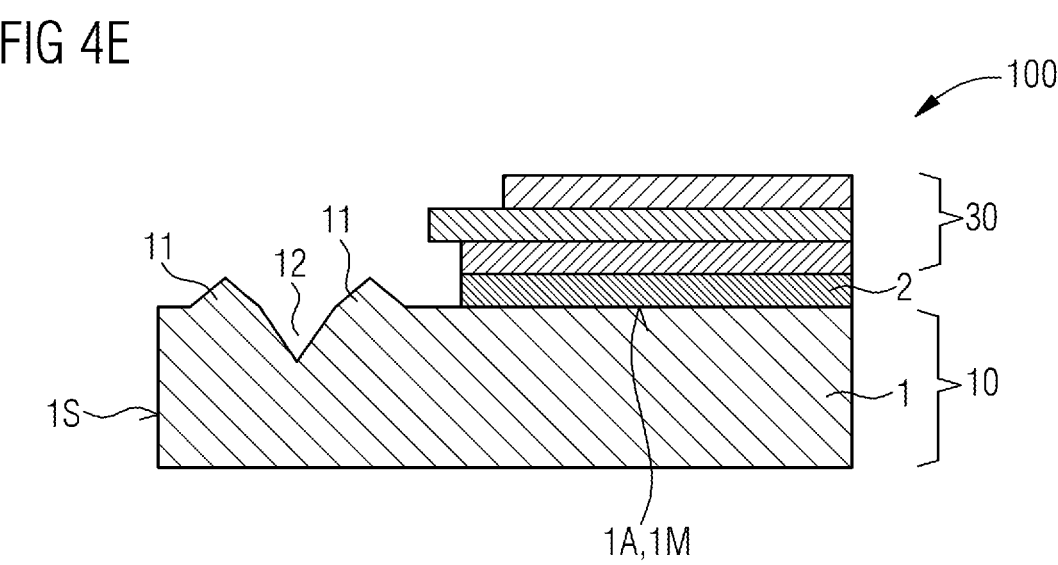

The power semiconductor module 100 shown in FIG. 4E essentially corresponds to the power semiconductor module 100 shown in FIG. 4D. In contrast, in least at one edge region on the front side 1A of the basic body 1, the basic body 1 has one groove 12 located between two sidewalls 11. As shown in FIG. 4E, the groove 12 can be directly adjacent to both sidewalls 11. It is also possible that the groove 12 is laterally spaced apart from both sidewalls 11 or directly adjoins one sidewall 11 and is spaced apart from the another sidewall 11.

Figures 4F, 4G:
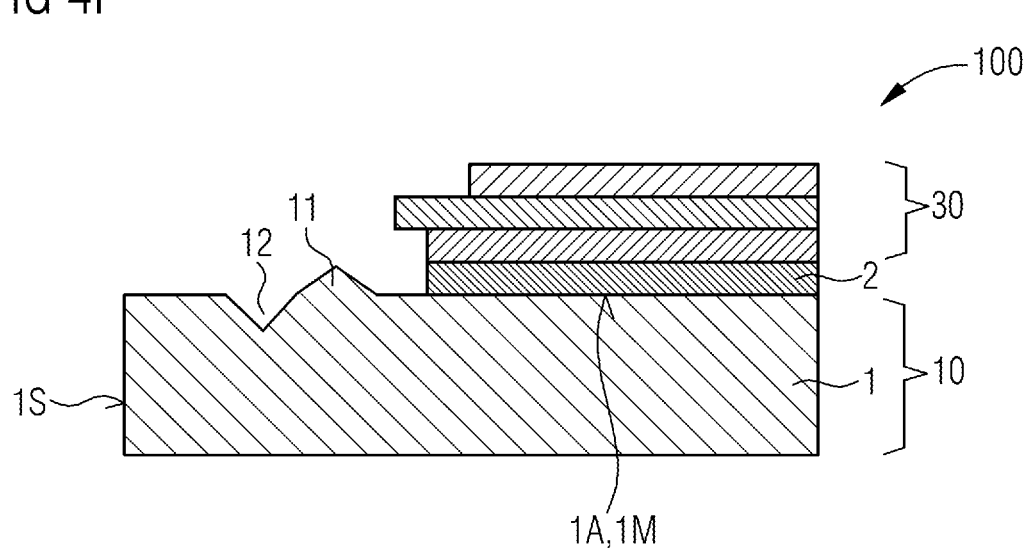

The power semiconductor module 100 shown in FIG. 4F essentially corresponds to the power semiconductor module 100 shown in FIG. 4D. In contrast, the positions of the sidewall 11 and of the groove 12 are interchanged. The groove 12 is located between the side surface 1S and the sidewall 11. The mounting area 1M can be delimited by the sidewall 11 which is located between the mounting area 1M and the groove 12.

The power semiconductor module 100 shown in FIG. 4G essentially corresponds to the power semiconductor module 100 shown in FIG. 4D or 4E. In contrast, in least at one edge region on the front side 1A of the basic body 1, the basic body 1 has more than one groove 12 and more than two sidewalls 11, here two grooves 12 and three sidewalls 11. Each of the grooves 12 is located between two sidewalls 11 and can directly adjoin or be spaced apart from at least one of the two sidewalls 11. It is also possible that each of the sidewalls 11 is located between two grooves 12 and can directly adjoin or be spaced apart from at least one of the two grooves 12.

In FIGS. 4A to 4G, only a partial sectional view of the base plate 10 or of the power semiconductor module 100 is illustrated. The sidewall/s 11, the groove/s 12 or any possible combinations of the sidewall/s 11 and of the groove/s 12 can be located along exactly one edge 1E, exactly along two adjacent or opposite edges 1E, exactly along three edges 1E or along all edges 1E of the basic body 1, i.e. in exactly one edge region, exactly in two adjacent or opposite edge regions, exactly in three edge regions or in all edge regions on the front side 1A of the basic body 1, respectively. The sidewall/s 11 and or the groove/s 12 can extend along the entire edge region/s or along some parts of the edge region/s as shown for instance in FIG. 2C.

Further embodiments of the present disclosure are provided in the following, wherein the numbering used in the following is intended to facilitate reference to features of other embodiments.

Embodiment 1: A base plate for a power semiconductor module, wherein the base plate comprises a basic body formed in one piece, the basic body has a front side and a rear side, the front side comprising a mounting area of the base plate, along at least one of its edges, the basic body has at least one elevated integral part forming at least one sidewall projecting beyond the mounting area by a vertical height, at regions of the mounting area, the basic body has a vertical thickness extending between the front side and the rear side, the vertical thickness being larger than the vertical height of the sidewall.

Embodiment 2: The base plate according to embodiment 1, wherein the elevated integral part forms at least two sidewalls projecting beyond the mounting area, and the least two sidewalls are located along two non-adjacent or opposite edges of the basic body.

Embodiment 3: The base plate according to embodiment 1, wherein the sidewall completely surrounds the mounting area.

Embodiment 4: The base plate according to one of embodiments 1 to 3, wherein the at least one sidewall has a vertical height between 0.05 mm and 5.0 mm inclusive and an average lateral width between 0.05 mm and 10 mm inclusive.

Embodiment 5: The base plate according to one of embodiments 1 to 4, comprising a plurality of cooling fins on the rear side.

Embodiment 6: The base plate according to one of embodiments 1 to 5, further comprises at least one groove which extends along at least one of the edges of the basic body, wherein along a lateral direction, the mounting area is delimited by the groove.

Embodiment 7: The base plate according to one of embodiments 1 to 6, wherein along at least one of the edges or along several edges, the basic body has both at least one sidewall and a groove, wherein in a plane view of the front side of the basic body, the groove is located between the mounting area and the at least one sidewall.

Embodiment 8: The base plate according to one of embodiments 1 to 5, wherein along at least one of the edges or along several edges, the basic body has both the at least one sidewall and a groove, wherein in a plane view of the front side of the basic body, the sidewall is located between the mounting area and the groove.

Embodiment 9: The base plate according to any of embodiments 6 to 8, wherein the groove is directly adjacent to the at least one sidewall.

Embodiment 10: The base plate according to one of embodiments 1 to 6, wherein along all edges, the basic body comprises either at least one sidewall or at least one groove but not both sidewall and groove at the same edge.

Embodiment 11: The base plate according to one of embodiments 1 to 9, wherein along at least one common edge, the basic body comprises at least two sidewalls and at least one groove, or at least one sidewall and at least two grooves.

Embodiment 12: A power semiconductor module comprising the base plate according to one of the preceding embodiments, further comprising a housing body, wherein the housing body laterally surrounds the base plate, and the sidewall is covered by the housing body and serves as an anchoring structure which additionally fixes the housing body to the base plate.

Embodiment 13: A power semiconductor module comprising the base plate according to one of embodiments 6 to 11, further comprising a housing body, wherein the housing body laterally surrounds the base plate, and the sidewall is covered by the housing body and the groove is at least partially filled by a material of the housing body so that both the sidewall and the groove serve as anchoring structures which additionally fix the housing body to the base plate.

Embodiment 14: The power semiconductor module according to one of embodiments 12 to 13, further comprising a module component, wherein the module component is fixed on the mounting area by a connection layer, and the housing body laterally surrounds the module component.

Embodiment 15: The power semiconductor module according to embodiment 14, wherein the sidewall and/or the groove are/is formed to prevent material of the connection layer from creeping towards an assembly surface.

The embodiments shown in the Figures as stated represent exemplary embodiments of the improved arrangement for a base plate and a power semiconductor module comprising a base plate; therefore, they do not constitute a complete list of all embodiments according to the improved arrangement for the base plate and the power semiconductor module comprising the base plate. Actual arrangements of the base plate or of the power semiconductor module may vary from the exemplary embodiments described above.

REFERENCE SIGNS 100 power semiconductor module
10 base plate
10S section of the base plate
20 housing body
30 module component/substrate/semiconductor chip
1 basic body
1A front side of the basic body
1B rear side of the basic body
1S side surface the basic body/of the base plate
1E edge of the basic body
1M mounting area of the basic body/of the base plate
1T vertical thickness of the basic body
1W diagonal lateral width of the basic body
1I lateral indentation of the basic body
1Z assembly surface
11 sidewall of the basic body
11A inner surface of the sidewall
11H vertical height of the sidewall
11W average lateral width of the sidewall
12 groove of the basic body
2 connection layer
3 cooling fin
4 terminal

What is claimed is:

1. A base plate for a power semiconductor module, wherein the base plate comprises:
a basic body formed in one piece, the basic body has a front side and a rear side, the front side comprising a mounting area of the base plate, along at least one of its edges, the basic body has at least one elevated integral part forming at least one sidewall projecting beyond the mounting area by a vertical height, at regions of the mounting area, the basic body has a vertical thickness extending between the front side and the rear side, the vertical thickness being larger than the vertical height of the sidewall, and
wherein along all edges, the basic body comprises either at least one sidewall or at least one groove but not both sidewall and groove at a same edge, wherein along at least one of its edges, the basic body comprises one elevated integral part forming the at least one sidewall.

2. The base plate according to claim 1, wherein the elevated integral part forms at least two sidewalls projecting beyond the mounting area, and the least two sidewalls are located along two non-adjacent or opposite edges of the basic body.

3. The base plate according to claim 1, wherein the basic body comprises two sidewalls located at two opposite edges and two grooves located at two another edges of the basic body.

4. The base plate according to claim 1, wherein the at least one sidewall has a vertical height between 0.05 mm and 5.0 mm inclusive and an average lateral width between 0.05 mm and 10 mm inclusive.

5. The base plate according to claim 1, comprising a plurality of cooling fins on the rear side.

6. The base plate according to claim 1, wherein the at least one groove extends along at least one of the edges of the basic body, wherein along a lateral direction, the mounting area is delimited by the groove.

7. The base plate according to claim 1, wherein the at least one sidewall is a vertical wall.

8. The base plate according to claim 1, wherein the at least one sidewall is an inclined wall.

9. The base plate according to claim 1, wherein the at least one sidewall is a round-shaped wall.

10. The base plate according to claim 1, wherein the at least one sidewall is formed partially as vertical wall and partially as inclined wall.

11. The base plate according to claim 1, the at least one sidewall is formed partially as vertical wall and partially as round-shaped wall.

12. The base plate according to claim 1, wherein the base plate is part of the power semiconductor module, the power semiconductor module comprising a housing body, wherein the housing body laterally surrounds the base plate, and the sidewall is covered by the housing body and serves as an anchoring structure which additionally fixes the housing body to the base plate.

13. A power semiconductor module comprising:
a base plate comprising:
a basic body formed in one piece, the basic body has a front side and a rear side, the front side comprising a mounting area of the base plate, along at least one of its edges, the basic body has at least one elevated integral part forming at least one sidewall projecting beyond the mounting area by a vertical height, at regions of the mounting area, the basic body has a vertical thickness extending between the front side and the rear side, the vertical thickness being larger than the vertical height of the sidewall, and
wherein along all edges, the basic body comprises either at least one sidewall or at least one groove but not both sidewall and groove at a same edge, wherein along at least one of its edges, the basic body comprises one elevated integral part forming the at least one sidewall; and a housing body, wherein the housing body laterally surrounds the base plate, and wherein the sidewall is covered by the housing body and the at least one groove is at least partially filled by a material of the housing body so that both the sidewall and the groove serve as anchoring structures which additionally fix the housing body to the base plate.

14. The power semiconductor module according to claim 13, further comprising a module component, wherein the module component is fixed on the mounting area by a connection layer, and the housing body laterally surrounds the module component.

15. The power semiconductor module according to claim 14, wherein the sidewall and/or the groove are/is formed to prevent material of the connection layer from creeping towards an assembly surface.

16. The base plate according to claim 1, wherein the at least one sidewall has an inner surface facing the mounting area, and the inner surface is inclined at an angle between 20° and 70° with respect to the mounting area.

17. The base plate according to claim 1, wherein the at least one groove has inner vertical surfaces which form an angle of 90° with respect to the mounting area.

18. The base plate according to claim 1, wherein the basic body comprises exactly two sidewalls located along two opposite edges and exactly two grooves located along two other opposite edges of the basic body.

19. The base plate according to claim 1, wherein the at least one sidewall extends along an entire edge of the basic body.

20. The base plate according to claim 1, wherein the at least one sidewall is spaced apart from a corresponding side surface of the basic body.

* * * * *